US008810020B2

(12) United States Patent
Kalandar et al.

(10) Patent No.: US 8,810,020 B2
(45) Date of Patent: Aug. 19, 2014

(54) SEMICONDUCTOR DEVICE WITH REDISTRIBUTED CONTACTS

(75) Inventors: Navas Khan Oratti Kalandar, Subang Jaya (MY); Chee Seng Foong, Sg Buloh (MY); Norazham Mohd Sukemi, Subang Jaya (MY); Kesvakumar V. C. Muniandy, Klang (MY)

(73) Assignee: Freescale Semiconductor, Inc., Austin, TX (US)

( * ) Notice: Subject to any disclaimer, the term of this patent is extended or adjusted under 35 U.S.C. 154(b) by 105 days.

(21) Appl. No.: 13/530,118

(22) Filed: Jun. 22, 2012

(65) Prior Publication Data
US 2013/0341796 A1 Dec. 26, 2013

(51) Int. Cl.
*H01L 21/78* (2006.01)

(52) U.S. Cl.
USPC ........... 257/690; 257/688; 257/689; 257/691; 257/692; 257/693

(58) Field of Classification Search
USPC .................................................. 257/688–695
See application file for complete search history.

(56) References Cited

U.S. PATENT DOCUMENTS

| | | | |
|---|---|---|---|
| 6,555,906 B2 * | 4/2003 | Towle et al. ................ | 257/723 |
| 6,678,948 B1 * | 1/2004 | Benzler et al. .............. | 29/840 |
| 6,701,614 B2 * | 3/2004 | Ding et al. .................. | 29/848 |
| 6,972,964 B2 * | 12/2005 | Ho et al. ..................... | 361/761 |
| 7,007,835 B2 * | 3/2006 | Deane et al. ............. | 228/180.22 |
| 7,223,924 B2 * | 5/2007 | Rosenau et al. ............. | 174/260 |
| 7,435,910 B2 * | 10/2008 | Sakamoto et al. ........... | 174/260 |
| 7,906,733 B2 * | 3/2011 | Kumakura ................... | 174/261 |
| 7,952,170 B2 * | 5/2011 | Pratt ........................... | 257/621 |
| 8,304,913 B2 * | 11/2012 | Nalla et al. .................. | 257/774 |
| 8,367,470 B2 * | 2/2013 | Pagaila ....................... | 438/108 |
| 8,421,212 B2 * | 4/2013 | Chen et al. .................. | 257/693 |
| 8,609,532 B2 * | 12/2013 | Swaminathan et al. ...... | 438/629 |
| 2010/0193944 A1 | 8/2010 | Castro | |
| 2011/0003470 A1 | 1/2011 | Burgess et al. | |
| 2011/0027984 A1 | 2/2011 | Ramanathan | |
| 2011/0101527 A1 | 5/2011 | Cheng et al. | |

OTHER PUBLICATIONS

Bernd Ebersberger, Charles Lee, "Cu Pillar Bumps as a Lead-Free Drop-in Replacement for Solder-Bumped, Flip-Chip Interconnects", 2008 Electronic Components and Technology Conference, pp. 59-66, IEEE 2008.

* cited by examiner

*Primary Examiner* — Eugene Lee
(74) *Attorney, Agent, or Firm* — Charles Bergere

(57) ABSTRACT

A semiconductor device has external, exposed electrical contacts at an device active face and a semiconductor die, which has internal, electrical contacts at a die active face. The exposed contacts are offset from the internal contacts laterally of the device active face. A redistribution layer includes a layer of insulating material and redistribution interconnectors within the insulating material, the interconnectors connecting with the exposed contacts. A set of conductors connect the internal contacts and the interconnectors. The conductors have oblong, tear drop shaped cross-sections extending laterally of the die active face beyond the respective internal contacts, and contact the interconnectors at positions spaced further apart than the internal contacts. The redistribution layer may be prefabricated using less costly manufacturing techniques such as lamination.

7 Claims, 1 Drawing Sheet

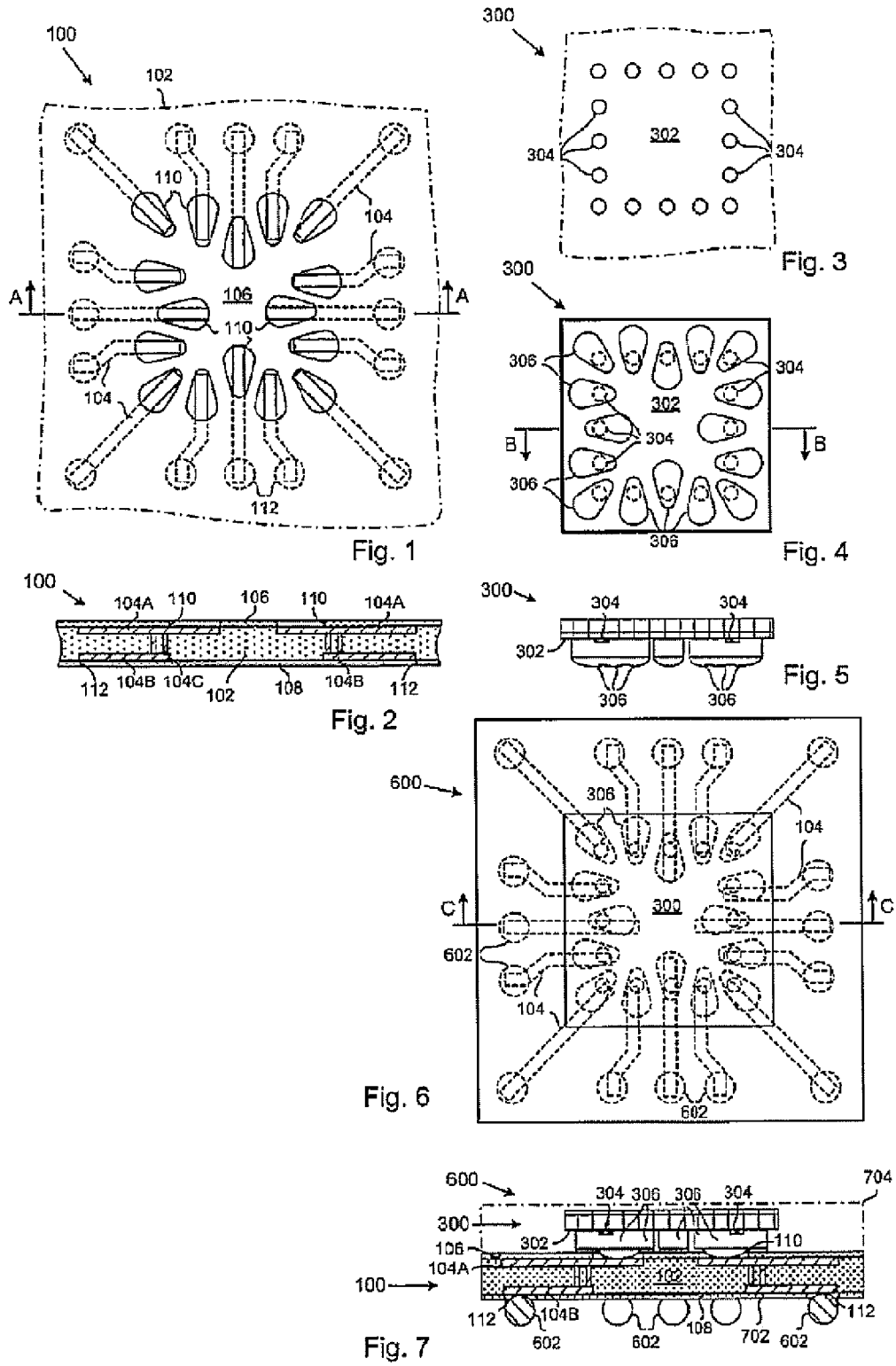

SEMICONDUCTOR DEVICE WITH REDISTRIBUTED CONTACTS

BACKGROUND OF THE INVENTION

The present invention is directed to semiconductor devices, and, more particularly, to semiconductor devices with redistribution connections between internal die contacts and external contacts exposed on an active face of the device package.

Semiconductor device packaging fulfils basic functions such as providing external electrical connections and protecting the die against mechanical and environmental stresses. Continued progress in die size reduction allows for reduced device size. However, the increased functionality and complexity of the integrated circuits require more external connections, making it difficult to reduce the overall package size.

Semiconductor devices often include multiple dies encapsulated by a molding compound. The electrical contacts for connection with external circuits are exposed at the active face of the package and connected internally with die contact pads on the semiconductor die of smaller size and spacing. The external contacts may be a ball grid array (BGA) or a land grid array (LGA), for example. Various techniques are available for connecting the exposed, external electrical contacts with the internal, die contacts.

Minimum values are specified for the size of the individual exposed, external contacts at the active face of the device and for the spacing between adjacent contacts. Such specifications necessitate a compromise between the overall size of the device active face and the number of individual electrical contacts. In wafer level packaging (WLP), a redistribution layer is built up on the wafer before adjacent devices are separated and encapsulated. The external device contacts are limited to the area of the active face of the die, and the redistribution layer acts to 'fan in' the contacts to make greater use of the available die face area, than if the external device contacts were aligned with the positions of the internal die contacts dictated by the morphology of the underlying integrated circuits.

In a technique known as redistributed chip packaging (RCP), a redistribution layer provides interconnections between the internal die contacts and the external exposed device contacts at the active face of the device, to route signals and power and ground connections. The redistribution layer "fans out" the die contacts, thereby offering a larger area than the active face of the die for the exposed, external device contacts and enabling larger exposed contacts to be used, with greater spacing between them.

In one RCP assembly technique, singulated dies are placed temporarily with their active faces on a substrate. The dies are encapsulated with a molding compound and then released from the substrate, forming a panel. The redistribution layer is then built up on the panel using wafer level processing techniques. The redistribution layer is built up by depositing alternating layers of insulating material and conductive material (i.e., metal layers), with vias providing connections between the metal layers. Connection with signal input/output and power and ground pads on the active faces of the dies may be made during electro-deposition of the interconnectors and vias. The devices are singulated after completion of the redistribution layer.

In another RCP production technique, a redistribution layer is prefabricated, for example using lamination operations to form alternating insulating and conducting layers, with the conducting layers connected with vias. Singulated dies are placed with their active faces on the prefabricated redistribution layer. Connection between the redistribution interconnectors and the signal input/output and power and ground internal contact pads on the active faces of the dies may be made by connector elements in the form of metal pillars or bumps, of copper for example. Connection between the metal pillars or bumps and the interconnectors of the redistribution layer may be established by fusion of solder cappings, for example. The dies on the redistribution layer are then encapsulated with a molding compound and adjacent devices are separated by singulation.

The prefabricated redistribution layer can represent a significant cost savings compared to the built-up redistribution layer but the manufacturing tolerances of positioning and dimensioning the interconnectors of the prefabricated redistribution layer are less tight, so the spacing and dimensions of the connections with the interconnectors must be larger than for a built-up redistribution layer. In both cases, it is desirable to improve the compromise between reducing the spacing of internal contact elements and increasing cost of the resulting packaged device by reducing manufacturing tolerances.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. In particular, for the sake of clear visualization, certain vertical dimensions have been exaggerated relative to certain horizontal dimensions.

FIG. 1 is a top view of a redistribution layer assembly for use in making redistributed chip package semiconductor devices in accordance with an embodiment of the invention, given by way of example;

FIG. 2 is a sectional view of the redistribution layer assembly of FIG. 1 along the line A-A;

FIG. 3 is a bottom view of an active face of a semiconductor die showing an array of contact pads;

FIG. 4 is a bottom view of the semiconductor die of FIG. 3 after forming connector pillars or bumps on the active face for use in making redistributed chip package semiconductor devices in accordance with an embodiment of the invention, given by way of example;

FIG. 5 is a sectional view of the semiconductor die of FIG. 4 along the line B-B;

FIG. 6 is a plan view of a redistributed chip package semiconductor device including the redistribution layer of FIG. 1 and the semiconductor die of FIGS. 4 and 5 in accordance with an embodiment of the invention, given by way of example; and FIG. 7 is a sectional view of the semiconductor device of FIG. 6 along the line C-C.

DETAILED DESCRIPTION OF THE INVENTION

FIGS. 1 and 2 illustrate a redistribution layer 100 for a semiconductor device 600, which is shown in FIGS. 6 and 7, in accordance with an example of an embodiment of the present invention, the redistribution layer 100 being part of a panel for use in making an array of the semiconductor devices 600. FIGS. 3, 4 and 5 illustrate a semiconductor die 300 for the semiconductor device 600 at different stages of manufacture. FIGS. 6 and 7 illustrate the semiconductor device 600 in accordance with this example of an embodiment of the present invention, but with an encapsulation layer removed for the purposes of illustration.

The semiconductor device 600 has an device active face 702, seen in FIG. 7 and a device set of exposed electrical contact elements 602 at the device active face 702. The semiconductor die 300 has an die active face 302 and a die set of internal electrical contact elements 304 at the die active face 302. The exposed electrical contact elements 602 are offset from the internal electrical contact elements 304 laterally of the device active face 702 and protrude from the device active face 702. The redistribution layer 100 includes a layer of insulating material 102 and redistribution interconnectors 104 within the insulating material 102, the interconnectors 104 connecting with the exposed electrical contact elements 602. A set of conductors 306 connect the internal electrical contact elements 304 and the interconnectors 104.

The conductors 306 have oblong cross-sections, as seen in FIGS. 4 and 6, extending laterally of the die active face 302 beyond the respective internal electrical contact elements 304, and contact the interconnectors 104 at positions spaced further apart than the internal electrical contact elements 304. The spacing and dimensions of the connections of the conductors 306 with the interconnectors 104 are larger than the internal electrical contact elements 304. An oblong cross-section presents a length greater than its width, facilitating larger spacing and dimensions of the connections with the interconnectors 104 without increased spacing of the internal electrical contact elements 304, and without additional layers of redistribution interconnectors.

Moreover, the conductors 306 have cross-sections presenting end portions of smaller width contacting the respective internal electrical contact elements 304 and enlarged end portions extending laterally of the die active face 302 beyond the respective internal electrical contact elements 304 and contacting the interconnectors 104 at positions spaced further apart than the internal electrical contact elements 304. The cross-section may be rounded and pear-shaped or tear-drop-shaped, for example. The end portions of smaller width accommodate a reduced spacing of the internal electrical contact elements 304, while the enlarged end portions offer an increased tolerance, and an increased connection area, for contact with the interconnectors 104.

The dimensional and positioning tolerances of the interconnectors 104 of the redistribution layer 100 may be wider than the internal electrical contact elements 304. The redistribution layer 100 may be pre-fabricated and may be made using less costly manufacturing techniques such as lamination. In another example, the redistribution layer 100 is built up on a panel, in which dies 300 are embedded in encapsulation material, using wafer processing techniques.

In more detail, as shown in FIGS. 1 and 2, in conventional manner the insulating material 102 of the redistribution layer 100 for each of the semiconductor devices 600 has a core with opposite faces on which solder-stop surface layers 106 and 108 are provided. The interconnectors 104 include traces 104A and 104B on opposite faces of the core, formed for example by deposition or printing, and vias 104C through the core which connect traces on the opposite faces. The traces 104A and 104B and the faces of the core are covered by the solder-stop surface layers 106 and 108 apart from openings 110 and 112 through which the conductors 306 and the exposed electrical contact elements 602 respectively can be soldered to the traces 104A and 104B of the interconnectors 104, the openings limiting the flow of the solder on the surface of the insulating layer 102.

FIG. 3 shows the semiconductor die 300 at a stage in its production where the semiconductor body has been formed with the die active face 302 and contact pads 304 have been formed on the die active face 302 to provide the internal electrical contact elements. The contact pads 304 are formed in this example for an array of the semiconductor dies on the semiconductor wafer, the semiconductor die 300 being shown in FIG. 3 before singulation. The sets of conductors 306 can be formed on the redistribution layer 100 in one embodiment of the invention. However, in order to avoid extra precise masking and plating operations on the redistribution layer 100, in the embodiment of the invention illustrated in FIGS. 4 to 7, the conductors 306 are formed on respective contact pads 304 on the semiconductor wafer before singulation of the semiconductor dies 300.

As shown in FIGS. 4 and 5, the conductors 306 have oblong cross-sections, extending laterally of the die active face 302 beyond the respective internal electrical contact element 304. The oblong, tear-drop cross-section of each of the conductors 306 has an enlarged end extending laterally of the die active face beyond the respective internal electrical contact element 304 for contacting the respective interconnector.

The enlarged ends of adjacent ones of the conductors 306 extend in different directions beyond the respective internal electrical contact element, so that the enlarged ends of the adjacent conductors are spaced further apart than the corresponding internal electrical contact elements 304. Adjacent to each side of the semiconductor die 300, the internal electrical contact elements 304 are aligned parallel to the adjacent side of the die. The enlarged ends of adjacent ones of the conductors 306 extend alternately inwards and outwards from the alignment of the internal electrical contact elements 304, except in the corners of the semiconductor die 300, where the enlarged ends extend diagonally outwards so as to be spaced further from the adjacent enlarged ends than the corresponding internal electrical contact elements 304. The height of the conductors 306 projecting from the die active face 302 is sufficient for the conductors 306 to form bumps or pillars, allowing encapsulation material, such as underfill or molding compound to flow in between the active face 302 of the die and the redistribution layer 100 during encapsulation. The encapsulation material may be epoxy or polymer material, for example.

The conductors 306 are capped by respective elements of fusible material contacting the respective interconnectors, which are then fused by heat or other energy. In this example, the body of each of the conductors 306 is formed on the wafer by depositing seed and under-bump metallization ('UBM') layers (not shown), plating metal such as copper for example to build up the bumps or pillars, and capping the bumps or pillars with solder to provide the fusible material. FIGS. 4 and 5 show the semiconductor die 300 after it has then been singulated from the semiconductor wafer.

The singulated semiconductor dies 300 are then positioned on the panel of redistribution layer 100 with the conductors 306 contacting respective ones of the traces 104A of the interconnectors 104 at positions spaced further apart than the internal electrical contact elements to form a flip-chip redistributed assembly. For purposes of visualization, the openings 110 in the stop-solder layer 106 are not shown in FIG. 6. However, as shown in FIG. 1, in this example the openings 110 in the stop-solder layer 106 are of similar shape to, but slightly bigger than the oblong cross-section of the conductors 306. In another example, the openings 110 in the stop-solder layer 106 are of different shape to the oblong cross-section of the conductors 306. The size and shape of the openings 110 and of the conductors 306 enable the enlarged ends of the conductors 306 to contact the traces 104A through the openings 110 in spite of a degree of misalignment between the conductors 306 and the traces 104A, as illustrated in FIG. 6. The traces 104A of the interconnectors extend along the oblong, tear-drop cross-section of the respective internal electrical contact element 306, so as to prolong and increase the contact area between the traces 104A and the conductors 306. The connection between the traces 104A and the conductors 306 is then established by reflow of the solder capping of the conductors 306.

The array of device sets of exposed electrical contact elements 602 is then formed at the device active face 702 and connected with the array of sets of interconnectors 104. In this example, the exposed electrical contact elements 602 are solder balls, forming a ball grid array, which connect in conventional manner with the traces 104B of the interconnectors 104 through the openings 112 in the stop-solder layer 108.

The semiconductor devices 600 are then encapsulated and singulated. In this example, the semiconductor devices 600 are encapsulated in a molding compound before singulation. FIGS. 6 and 7 illustrate the semiconductor device 600 after singulation of the redistribution layer 100, with the molding compound removed for the purposes of visualization, but showing the position of the molding compound by chain dotted lines 704.

A method of making surface mount semiconductor devices, such as the device 600, in accordance with an example of an embodiment of the invention, comprises providing a redistribution layer 100 including a layer of insulating material 102, and an array of sets of redistribution interconnectors 104 within the insulating material 102. An array of semiconductor dies 300 is provided, each having an active face 302 presenting a die set of internal electrical contact elements 304 at the active face 302. A set of conductors 306 is provided connecting the internal electrical contact elements 304 with the interconnectors 104.

The conductors 306 have oblong cross-sections extending laterally of the die active face 302 beyond the respective internal electrical contact element 304 and contacting the interconnectors 104 at positions spaced further apart than the internal electrical contact elements 304.

The conductors 306 have cross-sections presenting end portions of smaller width contacting the respective internal electrical contact elements 304 and enlarged end portions extending laterally of the die active face 302 beyond the respective internal electrical contact element 304 and contacting the interconnectors 104 at positions spaced further apart than the internal electrical contact elements 304.

In both cases, an array of device sets of exposed electrical contact elements 602 is provided at the device active face 702, the exposed electrical contact elements 602 being connected with the interconnectors 104. The semiconductor devices are encapsulated and singulated.

In the foregoing specification, the invention has been described with reference to specific examples of embodiments of the invention. It will, however, be evident that various modifications and changes may be made therein without departing from the broader spirit and scope of the invention as set forth in the appended claims. For example, the semiconductor material of the dies described herein can be any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A surface mount semiconductor device having a device active face, comprising:
   a semiconductor die having an die active face and a die set of internal electrical contact elements on said die active face;
   a device set of exposed electrical contact elements at said device active face, said exposed electrical contact elements being laterally offset from said internal electrical contact elements of said device active face and protruding from said device active face;
   a redistribution layer including a layer of insulating material and redistribution interconnectors within said insulating material, said interconnectors connected to said exposed electrical contact elements; and
   a set of conductors connecting said internal electrical contact elements and said interconnectors, said conductors having oblong cross-sections extending laterally of said die active face beyond the respective internal electrical contact elements and contacting said interconnectors at positions spaced from said internal electrical contact elements such that said die active face is spaced from said redistribution layer by said set of conductors.

2. The semiconductor device of claim 1, wherein adjacent ones of said conductors extend in different directions beyond the respective internal electrical contact element.

3. The semiconductor device of claim 1, wherein said interconnectors extend along said oblong cross-section of the respective conductor.

4. The semiconductor device of claim 1, wherein said conductors project from said die active face and have respective elements of material fused to the respective interconnectors.

5. A surface mount semiconductor device having a device active face, comprising:

a semiconductor die having a die active face and a die set of internal electrical contact elements on said die active face;

a device set of exposed electrical contact elements at said device active face, said exposed electrical contact elements being offset from said internal electrical contact elements laterally of said device active face and protruding from said device active face;

a redistribution layer including a layer of insulating material and redistribution interconnectors within said insulating material, said interconnectors connecting with said exposed electrical contact elements; and a set of conductors connecting said internal electrical contact elements and said interconnectors, said conductors having cross-sections presenting end portions of smaller width contacting the respective internal electrical contact elements and enlarged end portions extending laterally of said die active face beyond the respective internal electrical contact elements and contacting said interconnectors at positions spaced from said internal electrical contact elements such that said die active face is spaced from said redistribution layer by said set of conductors.

6. The semiconductor device of claim 5, wherein said enlarged end portions of adjacent ones of said conductors extend in different directions beyond the respective internal electrical contact element.

7. The semiconductor device of claim 5, wherein said conductors project from said die active face and have respective elements of material fused to the respective interconnectors.

\* \* \* \* \*